(12) United States Patent
Crippen et al.

(10) Patent No.: US 7,068,510 B2
(45) Date of Patent: Jun. 27, 2006

(54) DISSIPATING HEAT RELIABLY IN COMPUTER SYSTEMS

(75) Inventors: Martin Joseph Crippen, Apex, NC (US); Pat Gallarelli, Pittsboro, NC (US); Benjamin Michael Kreuz, Austin, TX (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 10/728,299

(22) Filed: Dec. 4, 2003

(65) Prior Publication Data

US 2005/0122691 A1 Jun. 9, 2005

(51) Int. Cl.
*H05K 7/20* (2006.01)

(52) U.S. Cl. .............. 361/702; 361/704; 257/716; 165/80.3

(58) Field of Classification Search ........ 361/704, 361/707, 709–721, 724, 727, 737, 753, 759, 361/687, 689; 165/80.2, 80.3, 185; 174/16.1, 174/16.3; 257/727, 718, 719, 712, 713
See application file for complete search history.

(56) References Cited

U.S. PATENT DOCUMENTS 5,500,556 A * 3/1996 Kosugi .................. 257/718
5,552,961 A * 9/1996 Van Gaal et al. ............ 361/700
5,754,401 A    5/1998 Saneinejad et al.
5,883,782 A * 3/1999 Thurston et al. ............ 361/704

(Continued)

FOREIGN PATENT DOCUMENTS

JP    2000196269 A    7/2000

OTHER PUBLICATIONS

IBM Technical Disclosure Bulletin, vol. 7, No. 1, Jun. 1964, p. 113, "Heat Conducting Vibration and Shock Mount" by M. C. Panaro.

(Continued)

*Primary Examiner*—Michael Datskovskiy
(74) *Attorney, Agent, or Firm*—Robert R. Williams

(57) ABSTRACT

A blade server module comprising: a housing assembly; a printed circuit board disposed within the housing assembly and mounted in a free-floating relationship thereto; a processor mounted on the printed circuit board; heat sink assembly disposed in the housing assembly in close proximity to the processor; and, one or more compliant compression elements disposed within the housing assembly so as to be preloaded to provide a force on the printed circuit board to force the heat source into thermal engagement with the heat sink assembly. Methods and systems are disclosed for effectively dissipating heat reliably in compact packaging arrangements that are particularly adapted for computing systems including blade servers.

10 Claims, 4 Drawing Sheets

U.S. PATENT DOCUMENTS

| | | | |
|---|---|---|---|
| 5,965,937 A * | 10/1999 | Chiu et al. | 257/716 |
| 5,990,549 A * | 11/1999 | Chiu et al. | 257/706 |
| 6,101,094 A | 8/2000 | Kermaani et al. | |
| 6,361,136 B1 * | 3/2002 | Watanabe et al. | 347/7 |
| 6,541,855 B1 * | 4/2003 | Uzuka | 257/712 |
| 6,809,930 B1 * | 10/2004 | Mueller et al. | 361/704 |
| 6,898,081 B1 * | 5/2005 | Liu et al. | 361/687 |
| 2003/0129863 A1 | 7/2003 | Alcoe et al. | |
| 2004/0132331 A1 * | 7/2004 | Osborn et al. | 439/485 |
| 2005/0088822 A1 * | 4/2005 | Oberlin et al. | 361/700 |

OTHER PUBLICATIONS

IBM Technical Disclosure Bulletin, vol. 24, No. 5, Oct. 1981, pp. 2534-2535, "Flip Chip Heat Sink" by A. H. Bauman and D. G. Peterson.

IBM Technical Disclosure Bulletin, vol. 29, No. 11, Apr. 1987, pp. 4950-4951, "Thermal Sponge" by S. K. Kang, P. G. Ledermann and P. A. Moskowitz.

* cited by examiner

DISSIPATING HEAT RELIABLY IN COMPUTER SYSTEMS

BACKGROUND OF THE INVENTION

The present invention relates generally to methods and apparatus for effectively dissipating heat reliably in compact packaging arrangements that are particularly adapted for computing systems including blade server systems.

Advancing high-density semiconductor integrated systems have increased thermal management demands being placed thereon. These demands are attributable, in large part, to newer microprocessors, integrated circuits, and other electronic components requiring more power. They are also brought about by the continuing trend toward even more compact packaging environments. One example of such thermal management issues in the computer industry arises in connection with blade servers. Blade servers are a relatively new technology that provide for a more compact server system. Blade servers are smaller than traditional rack-mounted servers are, and a console thereof allows several of modules to share a variety of resources, such as power, switch, management, and blower modules. These blade server modules are hot-swappable and perform data processing. The modules are pluggable into a console that holds several such modules. Because these modules house microprocessors that require high operating power that generate significant heat, heat damage to the modules is a major concern.

Heat sinks are traditionally used for addressing heating issues, particularly in the foregoing environments. It is not uncommon to have heat sinks formed with fins or other similar structures to increase the surface area of the heat sink, whereby air can pass thereover so as to enhance heat dissipation. For example in data processing or server blade modules, one known solution is the use a heat sink and fan combination. Specifically, a fan is directly mounted on top of upstanding cooling fins of the heat sink. While this kind of configuration is relatively successful in terms of controlling heat, nevertheless, the stacking of the cooling fan on fins presents significant packaging issues in environments where space is a premium. For example, this construction inhibits making server blade modules satisfy 1U form factor dimension requirements. Moreover, the construction, installation, and maintenance of cooling fans on heat sink fins are relatively costly and laborious endeavors. In addition, because server blade modules are subjected to relatively considerable manual handling and therefore vibration and shock, it is important the processor chips remain in continuous thermal engagement with the heat sink.

Accordingly, needs exist for simply and reliably controlling heat from heat sources in compact electronic devices, such as blade server modules.

SUMMARY OF THE INVENTION

The present invention provides enhanced heat dissipating method and apparatus in relationship to electronic devices in a manner substantially without negative effect and that overcome many of the disadvantages of prior art arrangements.

In an illustrated embodiment, provision is made for an electronic device comprising: a housing assembly; a supporting element disposed in the housing assembly and mounted in a generally free-floating relationship thereto; a heat source mounted on the supporting element; a heat sink surface in the housing assembly in close proximity to the heat source; and, at least one compliant compression element disposed within the housing assembly and being preloaded for resiliently loading the heat source into continuous thermal engagement with the heat sink surface, and compensate for displacements of the supporting element and expansion of the compliant compression element by heat.

Further in accordance with the present invention, provision is made for a method of thermally coupling a processor to a heat transfer surface that is disposed within a contact region of the processor, comprising: a) positioning a processor on a freely-floating printed circuit board; (b) positioning a heat transfer surface in spaced relationship to the processor and within the contact region; (c) positioning one or more compliant compression elements relative to the printed circuit board so as to urge the processor into continuous thermal engagement with the heat transfer surface; and, (d) compressing the compliant compression element to resiliently preload it by an amount that provides a predefined retaining force urging the processor into thermal coupled engagement with the heat transfer surface, and compensate for displacements of the printed circuit board and expansion of the compliant compression element by heat.

One aspect in accordance with the present invention is that it provides an improved heat dissipating method and apparatus for protecting electronic devices against excessive heat build-up.

Another aspect in accordance with the present invention is that it provides an improved heat dissipating method and apparatus that reliably dissipates heat within a computer system.

In accordance with another aspect, provision is made for an improved heat dissipating method and apparatus that are reliable in operation within a blade server module.

Another aspect of the present invention is that it allows construction of simpler and more compact computer blade module.

An aspect of the present invention is that it relates to providing electronic devices with reliable heat transfer capacity while minimizing the physical profiles of the devices and thermally induced degradations.

Another aspect of the present invention is that it allows construction of thinner blade server modules thereof providing for higher density blade computing.

Another aspect of the present invention is that it provides for the advantage of minimizing the overall size and weight of the module while stably maintaining the ability to apply adequate retaining forces.

In accordance with the present invention, another aspect is that it provides an improved heat dissipating method and apparatus that prevents against excessive heat build-up by ensuring engagement between a heat source and a heat transfer device.

The aspects described herein are merely a few of several that can be achieved by using the present invention. The following descriptions do not suggest, however, that the invention must be used only in a manner to attain the foregoing aspects. These and other features and aspects of the present invention will be more fully understood from the following detailed description of the preferred embodiments, which should be read in light of the accompanying drawings. It should also be understood that both the foregoing generalized description and the following detailed description are exemplary, and are not restrictive of the invention.

BRIEF DESCRIPTION OF THE DRAWINGS

The present invention together with the above and other aspects and advantages may best be understood from the following detailed description of the preferred embodiments of the invention illustrated in the drawings, wherein.

DETAILED DESCRIPTION

Figure 1:
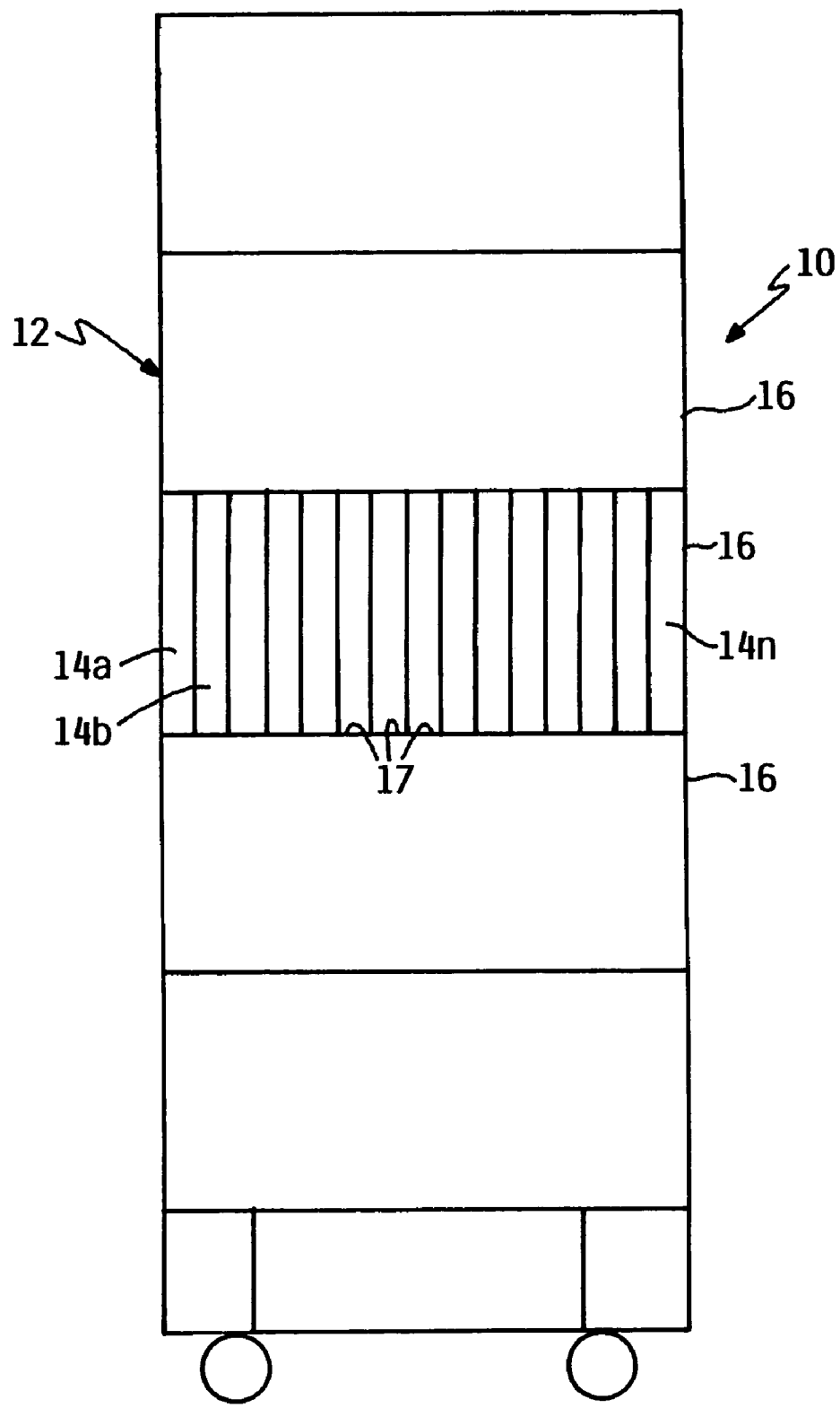
FIG. 1 is a schematic view of one preferred embodiment of a blade server system including a plurality of data processing modules that is pluggable within a blade server console.

Reference is made to FIGS. 1–4 for illustrating an exemplary embodiment of a data processing system 10 according to this invention. The data processing system 10 may include a blade server console 12. The blade server console 12 may provide shared components (not shown), such as power supplies, fans, or media access devices, which can be shared among all of a plurality of blade server modules $14_{a-n}$ (collectively 14). The blade server console 12 is operable for managing the blade server modules 14. The blade server console 12 may be an IBM eBlade servercenter that is commercially available from the International Business Machines Corporation, Armonk, N.Y. Other suitable blade server consoles are contemplated by this invention. Each of the blade server modules 14 may be slidably received within a plurality of racks 16 that are vertically spaced. Specifically, the blade server rack 16 includes slots 17 in adjacent, side-by-side fashion, each one of which is for removably receiving therein a corresponding one of the blade server modules 14. Each of the blade server modules 14 is, preferably, hot-pluggable and serves as a field replaceable unit (FRU). Each of the blade server modules 14 may provide data processing functions and is also available from International Business Machines Corporation, Armonk, N.Y.

Figure 2:
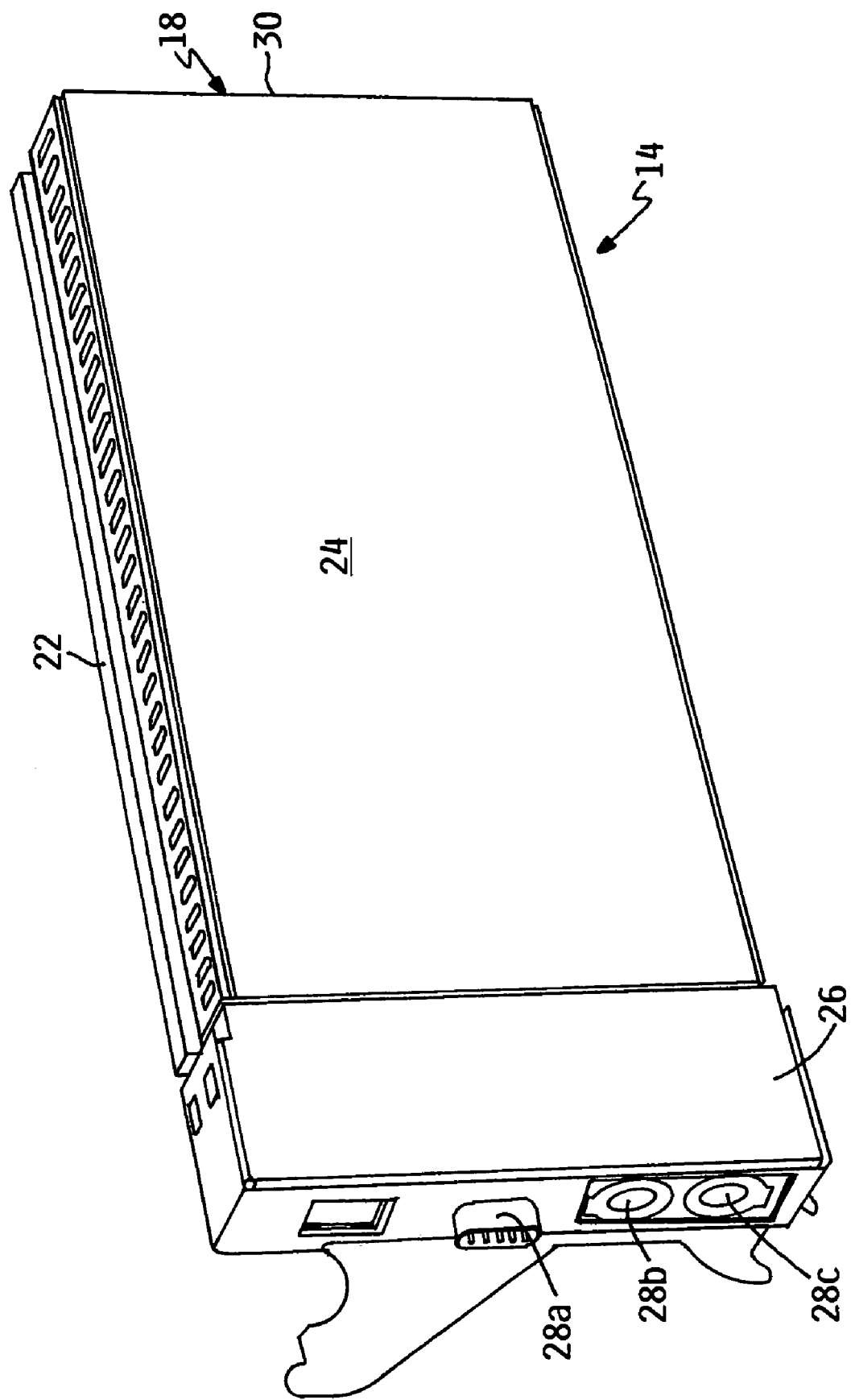
FIG. 2 is a perspective view of a data processing, blade server module.
Figure 3:
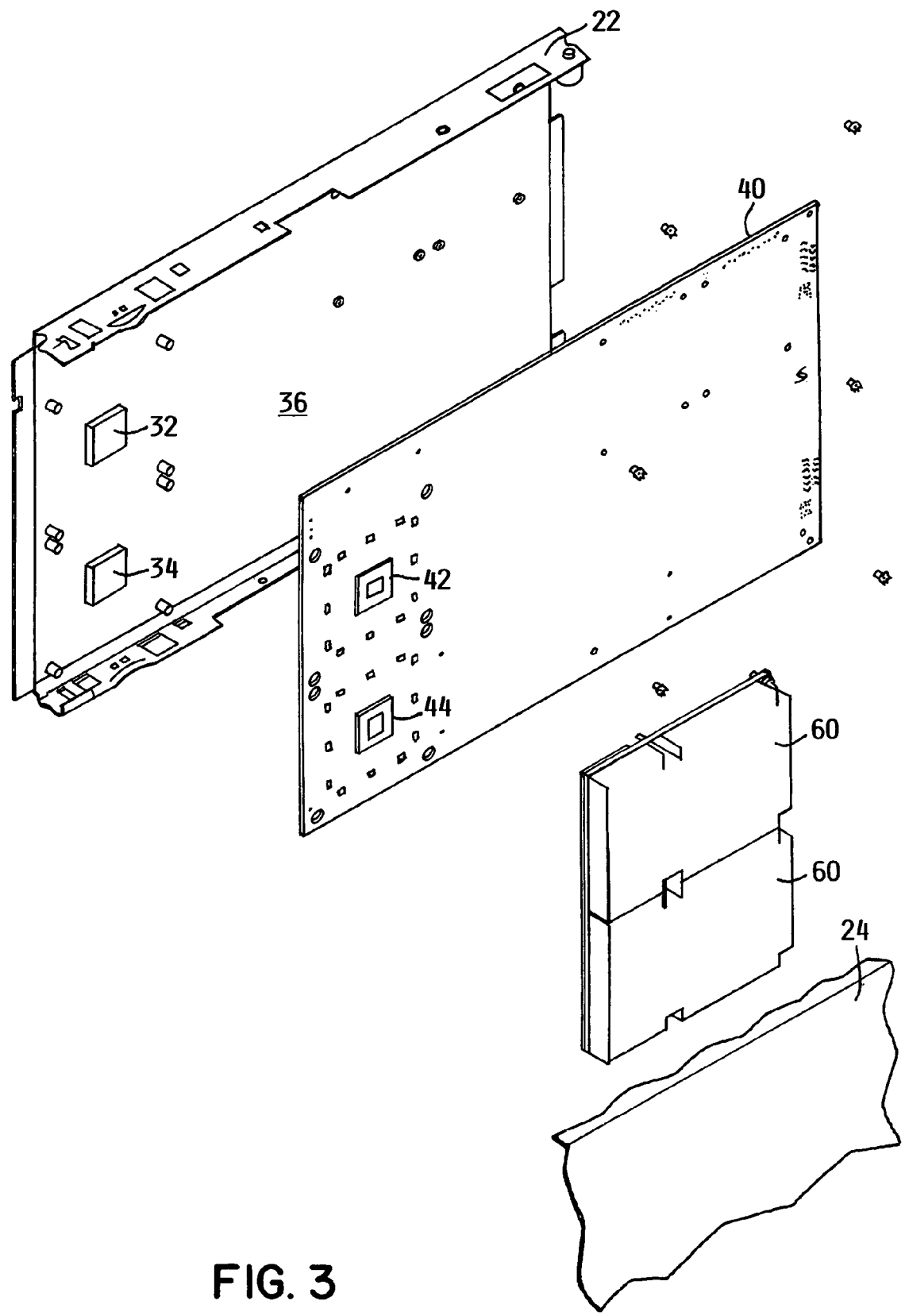
FIG. 3 is an exploded perspective view illustrating components of a blade server module including an improve heat transfer arrangement of the present invention.
Figure 4:
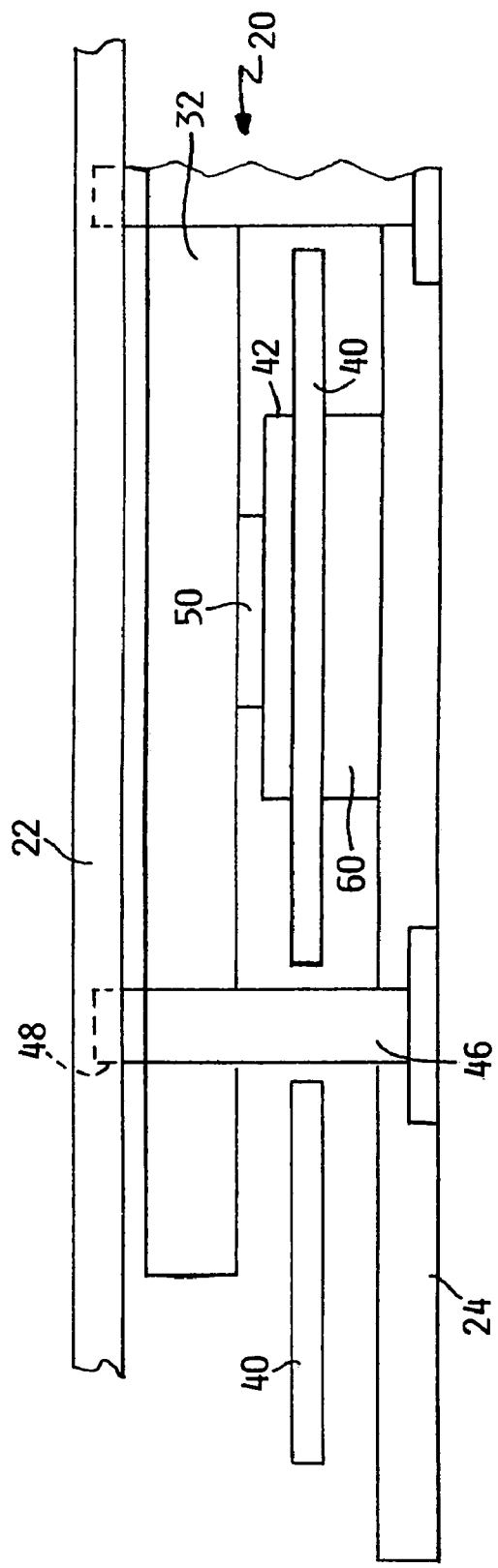
FIG. 4 is a schematic view illustrating aspects of the improved heat transfer assembly of the present invention.

FIGS. 2–4 are schematic views illustrating exemplary aspects of a blade server module 14 of the type within which the present invention is implemented. While the following description is in the context of a blade server environment, it is to be understood that this invention is not so limited, but is envisioned for use in electronic devices or the like wherein it is desired to dissipate heat from heat generating components.

The blade server module 14 comprises a generally modular housing assembly 18 in which is disposed the improved heat dissipating apparatus 20 of the present invention. The blade server module 14 may have a variety of shapes and sizes, such as the illustrated generally parallelepiped construction. Only those aspects of the housing assembly 18 needed to understand the present invention will be described. Included in the blade server module 14 is a pair of elongated sidewall portions 22, 24. The sidewalls portions 22, 24 are made of a suitable material, such as an EMI suppressing metal as stainless steel or the like. The sidewall portions 22, 24 when joined are connected to a front end cap member 26 that defines opening for one or more connectors 28a–c (collectively 28). The connectors 28 can be any suitable kind that are appropriate for the operation of the blade server module. An end wall 30 is provided having connectors (not shown) that facilitate coupling to the console. A pair of thermal heat sink elements 32, 34 is mounted on an internal surface 36 of the sidewall 22. While this embodiment discloses a pair of adjacent heat sinks mounted on an interior surface of the sidewall, it is to be understood that one or more can be provided at a variety of locations. The heat sink elements 32, 34 can be made of any suitable material that provides desired thermal conductivity for the purposes intended. For example, the heat sink elements can be a relatively large wide vapor phase heat sink elements wherein the surface area of engagement is intended to exceed the surface area of the processor assemblies.

A printed circuit board 40 having a generally elongated construction, such as depicted in FIG. 3, is disposed within the housing assembly 18 intermediate the sidewall portions 22, 24. The printed circuit board 40 carries at least a pair of processor assemblies 42 and 44. The processors when operable represent sources of heat. In the illustrative embodiment of the processor, a ceramic column grid array processor may be used. Any suitable processor can be used, such as from the Power PC family. The printed circuit board 40 may have other components thereon that do not form aspects of the present invention. The printed circuit board 40 is mounted for limited free-floating movement within the housing assembly, in a vertical direction as viewed in FIG. 4, along the standoffs 46 that are mounted on the sidewall portion 24. Each of the standoffs 46 has a threaded member portions 48 at the end thereof that is threadedly connected to the sidewall portion 22 (FIG. 4). By thereby tightening the threaded member 48 the two sidewall portions 22, 24 can be displaced towards each other under a controlled force for purposes which will be explained. In this exemplary embodiment, while the threaded member portions 48 are utilized for applying forces as will be described, the present invention contemplates other mechanisms for applying retaining forces to urge the processor assemblies into heat transfer engagement with the heat sink assemblies. Significant loading issues are removed from the printed circuit board.

A thermal interface layer 50 is interposed between the processors 42, 44 and their respective heat sink elements 32, 34. The thermal interface layer 50 can be made of a suitable thermal interface material, such as a thermal paste or any other suitable thermal adhesive having the properties enumerated below. While a thermal interface paste material may be used in the present combination, such paste need not be present. The thermal interface layer can have a suitable thickness which is defined consistent with known approaches to one of ordinary skill in the field. The thermal interface layer 50 is adapted to remain in continuous engagement to and between the heat sink and the processor so that the heat of the processors can effectively be transferred to the heat sink. If there are discontinuities in the thermal interface layer 50 caused by cracking, or if the paste layer no longer continuously engages between the heat sinks and the processors, then the desired heat transfer is diminished. This is because air, which serves as an insulator, may occupy spaces created by cracking or delaminating. Cracking or delaminating may occur for several reasons. One reason includes having the printed circuit boards mounting the processors bend so that the thin thermal interface layer also bends. Bending might occur in those situations in which the retaining forces for urging engagement of the processors with the heat sink are relatively high enough to deflect the board and processors relative to the heat sink elements. As a result, bending results in separation of the processors from the heat sink elements. By having the printed circuit board in free-floating arrangement, there is less of a tendency for the board to bend. Therefore, it is desirable to maintain retaining forces in a range that, preferably, may not allow the printed circuit board to bend, but yet is sufficient to retain the processors in continuous engagement with the heat sink elements. It is also desirable to maintain a relatively constant residual force on the thermal interface layer despite thermal variations encountered that would otherwise result in the forces applied exceeding the desired range. Variations might occur as a result of thermal creep affecting the forces being urged by a compression compliant assembly.

Continued reference is made to FIGS. 2–4 in which a pair of compliant compression elements or pads 60 is disposed within the housing assembly. Each of the compression pads 60 is for use with a corresponding one of the processors 42 and 44. A suitable adhesive may secure the compression elements or pads 60 to internal wall surfaces of the sidewall 24. Each of the compression pads 60 has a relatively thin prism-like construction. The compression pads 60 can be made of a flexibly resilient foam material that when pre-loaded provides retention forces adequate for continuously urging and retaining the processors in intimate engagement with the heat sinks, whereby the thermal interface paste does not crack and the desired heat transfer occurs. The compression pads 60 are flexibly resilient in nature to retain adequate forces for urging the processors, carried on the printed circuit board, into engagement with the heat sinks despite vertical (see FIG. 4) displacements of the printed circuit board. Accordingly, the compression pads are a thin and low cost approach for maintaining the forces necessary for effective heat transfer despite movement of the printed circuit board and temperature variations. The compression pads have a surface area larger than the heat sink elements. This facilitates the maintenance of a relatively uniform pressure in the thermal interface layer.

The compression pads 60 are preloaded under force applied by drawing the sidewalls together, as by activation of the threaded members 48. The compression pads 60 once compressed by a certain amount are effectively preloaded. The preloading is for resiliently urging the processor and the thermal layer into engagement with the heat sink with a predefined resilient force which will compensate for displacements in the printed circuit board and any thermal variations causing the materials to expand when heated. For insuring that the compression pads 60 do not have their performance degrade over time, such as through thermal creep, the pads are constructed of a thin and flexibly resilient material as will be described.

The compression pads 60 are relatively thin, thereby enhancing a compact construction. In an exemplary embodiment, the pads may have thicknesses of approximately ⅛ inch. Other thicknesses may be provided depending on the space constraints in which the compression pads are to operate. While a pair of compression elements is provided, it will be appreciated that any suitable number can be applied. It will be also be appreciated a single larger compression element that bridges both processors could be utilized as well. Also, the compression pads 60 provide a relatively large area for effecting contact, thereby insuring a more uniform application of forces across the thermal interface layer. Ideally, in terms of surface area they cover the entire thermal layer. In an exemplary embodiment, the compression pads 60 are made of BF-1000 Silicone elastomeric foam. This silicone plastic material remains resilient over a wide range of temperatures, whereby it can retain the forces it applies. In this embodiment, the ⅛ (0.0125) inch pads are compressed by 0.0625 inches for providing a pre-loading force of about fourteen (14) pounds. Other thicknesses may be provided depending on the space constraints in which the compression pads are to operate. For example, if the pad thickness is 0.250 inches, such can be compressed by about 0.125 inches to provide a pre-loading force of about twenty-eight (28) pounds. The BF-1000 Silicone may be purchased from a variety of sources, such as Rogers Corp., Elk Grove Village, Ill. This open cell silicone foam remains resilient over a wide range of environmental extremes in terms of temperature and has good physical, electrical, and environmental properties. It has low thermal creep characteristics that will provide for a long life span. Significantly, this material will retain much of its initial loading for a relatively prolonged period of time despite high temperatures. BF-1000 Silicone foam is but one example of a material that provides for the foregoing characteristics. Whatever materials are selected they should provide the necessary resiliency to achieve the foregoing described advantages. Otherwise air which acts as an insulator is allowed to interfere with desired heat transfer. Accordingly, the compression pads are a thin and less expensive approach for maintaining the forces necessary for effective heat transfer despite movement of the printed circuit board and temperature variations.

The heat dissipating apparatus has been described for use in combination with a blade server module. It will be appreciated that the heat dissipating apparatus may also be used in computer systems, such as a PC, a server, a client, a terminal, a mainframe, a PDA, a laptop or the like. The invention is not limited to particular computer systems or electronic devices.

From the foregoing description, the foregoing listed aspects of the invention are achieved. Hence, the method and apparatus of this invention enable successful operation of the heat transfer in the blade servers without the latter prematurely failing under a wide variety of adverse heating environments. Significantly, operation of the method and apparatus of this invention provide significant advantages because of the heat transfer arrangement is successful in suppressing heat build-up yet is capable of being mounted in confined spaces, thereby reducing the overall size if the module. Another aspect of the present invention is that it allows construction of simpler and more compact computer blade module that is relatively economically produced, assembled, and maintained. Of course this construction enhances higher density blade constructions.

The embodiments and examples set forth herein were presented to explain best the present invention and its practical applications, thereby enabling those skilled in the art to make and use the invention. However, those skilled in the art will recognize that the foregoing description and examples have been presented for the purposes of illustration and example only. The description set forth is not intended to be exhaustive or to limit the invention to the precise forms disclosed. In describing the above-preferred embodiments illustrated in the drawings, specific terminology has been used for the sake of clarity. However, the invention is not intended to be limited to the specific terms selected. It is to be understood that each specific term includes all technical equivalents that operate in a similar manner to accomplish a similar purpose. Many modifications and variations are possible in light of the above teachings without departing from the spirit and scope of the appended claims.

What is claimed is:

1. A blade server module comprising:
   a housing assembly;
   a printed circuit board disposed within the housing assembly and mounted for limited free-floating movement within the housing assembly, in a vertical direction thereto;
   a processor mounted on the printed circuit board;
   a heat sink surface disposed in the housing assembly in close proximity to the processor; and,
   at least one compliant compression element disposed within the housing assembly and being preloaded for resiliently loading the processor into continuous thermal engagement with the heat sink surface, and compensate for displacements of the printed circuit board and expansion of the compliant compression element by heat.

2. The module of claim 1 wherein the one compliant compression element comprises a thin and flexibly resilient pad that assists in retaining the loading despite changes in temperature.

3. The module of claim 2 wherein the thin and flexibly resilient pad is an open cellular material.

4. The module of claim 3 wherein the open cellular foam material is BF-1000 silicone.

5. The module of claim 1 further comprising a thermal interface paste between the processor and the heat sink surface.

6. The module of claim 3 further comprising the resilient pad being in direct contact with a surface of the printed circuit board which is opposing a surface carrying the processor.

7. A blade server system comprising:
   a blade server console constructed for pluggable reception of corresponding ones of blade server modules; and,
   one or more blade server modules, each of which is for plugging into the blade server console;
   each one of the blade server modules comprising a first sidewall portion and a second sidewall portion;
   each one of the blade server modules further comprising:
   a printed circuit board disposed between the first sidewall portion and the second sidewall portion, the printed circuit board mounted for limited free-floating movement within each one of the blade server modules, in a vertical direction relative to the sidewall portions of each one of the blade server modules; a processor mounted on the printed circuit board; a heat sink surface in close proximity to the processor; and, at least a compliant compression element preloaded to resiliently urge the printed circuit board into continuous thermal engagement with the heat sink surface with a predefined retention force.

8. The system of claim 7 wherein the compliant compression element includes a thin and flexibly resilient pad that retains loading characteristics despite changes in temperature.

9. The system of claim 8 wherein the compliant compression element is an open cell foam material.

10. The system of claim 9 further comprises a thermal interface paste between the processor and the heat sink surface.

* * * * *